(12) United States Patent  (10) Patent No.: US 8,742,860 B2
Naito  (45) Date of Patent: Jun. 3, 2014

(54) MEMS RESONATOR AND ELECTRICAL DEVICE USING THE SAME

(75) Inventor: Yasuyuki Naito, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/562,678

(22) Filed: Jul. 31, 2012

(65) Prior Publication Data

US 2013/0033334 A1  Feb. 7, 2013

(30) Foreign Application Priority Data

Aug. 5, 2011  (JP) .................................. 2011-171735

(51) Int. Cl.
*H03B 5/30*  (2006.01)

(52) U.S. Cl.
USPC ....................................... 331/154; 331/116 M

(58) Field of Classification Search
USPC ............. 331/116 M, 154–156; 310/320, 328, 310/333, 365; 333/187, 197, 200
See application file for complete search history.

(56) References Cited

U.S. PATENT DOCUMENTS

| 7,358,648 | B2* | 4/2008 | Nakamura et al. ............. 310/333 |
| 7,579,662 | B2 | 8/2009 | Tanaka |
| 2008/0266008 | A1* | 10/2008 | Hashimura .................... 331/154 |
| 2011/0260810 | A1* | 10/2011 | Quevy et al. ................... 333/200 |

FOREIGN PATENT DOCUMENTS

JP  2007-116700  5/2007

* cited by examiner

*Primary Examiner* — Joseph Chang
*Assistant Examiner* — Jeffrey Shin
(74) *Attorney, Agent, or Firm* — Wenderoth, Lind & Ponack, L.L.P.

(57) ABSTRACT

A MEMS resonator includes a beam oscillator that oscillates mechanically when an electrostatic force is applied. A supporter oscillates along with the oscillator and supports the oscillator; and at least one electrode includes an opposing face to the oscillator across a gap, wherein an electric current generated by the oscillation of the oscillator is output through an output terminal connected with the oscillator or electrode. The oscillator oscillates in a torsional resonance mode with a center being a longitudinal axis of the oscillator, and opposing faces of the oscillator and the electrode are made of semiconductors of which the conductive types are different from each other. Additionally, a surface part of the oscillator including the opposing face is doped with an impurity at a higher density than other part of the oscillator.

10 Claims, 9 Drawing Sheets

MEMS RESONATOR AND ELECTRICAL DEVICE USING THE SAME

BACKGROUND OF THE INVENTION

1. Field of the Invention

The present invention relates to a MEMS resonator and an electrical device using the same.

2. Description of the Related Art

Microelectromechanical systems (MEMS) are expected to be applied to many fields such as high-frequency/wireless, optics, acceleration sensors, biology and power. Since MEMS have advantages that they are small comparing with other conventional circuit components, and can be manufactured by a method that is compatible with semiconductor manufacturing methods, they allows downsizing, integration and cost reduction of an electrical device.

As home appliances and information communication devices have become common, downsizing of circuit components has been being desired. Specifically, it has been being desired that components such as resonators, filters and switches, which are externally mounted on IC (integrated circuit) chips, are downsized or embedded into the chips. Among these components, quartz resonators are used as resonators for oscillators that generate a specific signal. The quartz resonators are a circuit component that is difficult to downsize.

As a substitute for quartz resonators, MEMS resonators, which are manufactured by MEMS techniques, are supposed to be promising. A MEMS resonator is an element that generates an electrical signal having a frequency equal to the resonance frequency of mechanical oscillation of a microoscillator, and is composed of the oscillator and at least one electrode that is opposed to the oscillator in which one of the oscillator and the electrode functions an excitation electrode and the other functions as a detection electrode. The oscillator is excited when an electrostatic force is applied by a voltage amplitude of a high frequency signal input to the excitation electrode and a DC drive voltage applied to the oscillator. The distance and capacitance between the oscillator and detection electrode change according to the oscillation of the oscillator. Since a drive voltage is applied, electricity is repeatedly charged to the MEMS resonator and discharged from the MEMS resonator, and the MEMS resonator outputs an AC signal accordingly. Among a plurality of frequency components that are included in the high frequency signal, the output signal only includes a high frequency component that is equal to the resonance frequency of the mechanical oscillation of the oscillator. The MEMS resonator therefore functions as a signal frequency selective element (filter).

The MEMS resonators have the above-mentioned advantages of the MEMS. The MEMS resonators are therefore expected as an element that is supposed to greatly contribute to downsizing of resonators, comparing to conventionally used quartz resonators.

JP-A-2007-116700 discloses a method of increasing an output signal of MEMS resonators, in which p- and n-type semiconductors are used as the materials of an oscillator and electrode respectively.

SUMMARY OF THE INVENTION

An object of one of aspects of the present invention is to provide a MEMS resonator in which fluctuation of the resonance frequency is reduced without increasing a size and cost of the device.

In order to achieve the above object, the present invention provides a MEMS resonator as one of the aspects thereof, including:

a beam oscillator that oscillates mechanically when an electrostatic force is applied;

a supporter that oscillatably supports the oscillator; and at least one electrode that includes an opposing face to the oscillator across a gap, wherein one of the oscillator and electrode is an input electrode and the other is an output electrode, the oscillator is excited by the electrostatic force caused by an AC signal that is applied through an input terminal connected with the input electrode, and an electric current generated by the oscillation of the oscillator is output through an output terminal connected with the output electrode, the oscillator oscillates in a torsional resonance mode with a center being a longitudinal axis of the beam oscillator, an opposing face of the oscillator and the opposing face of electrode that are opposed to each other are made of impurity-doped semiconductors of which conductive types are different from each other respectively, and a surface part of the oscillator including the opposing face to the electrode is doped with an impurity at a higher density than other part of the oscillator.

According to the above-described aspect of the present invention, fluctuation of the resonance frequency is reduced without increasing a size and cost of a MEMS resonator.

DETAILED DESCRIPTION OF THE INVENTION

Figure 1:
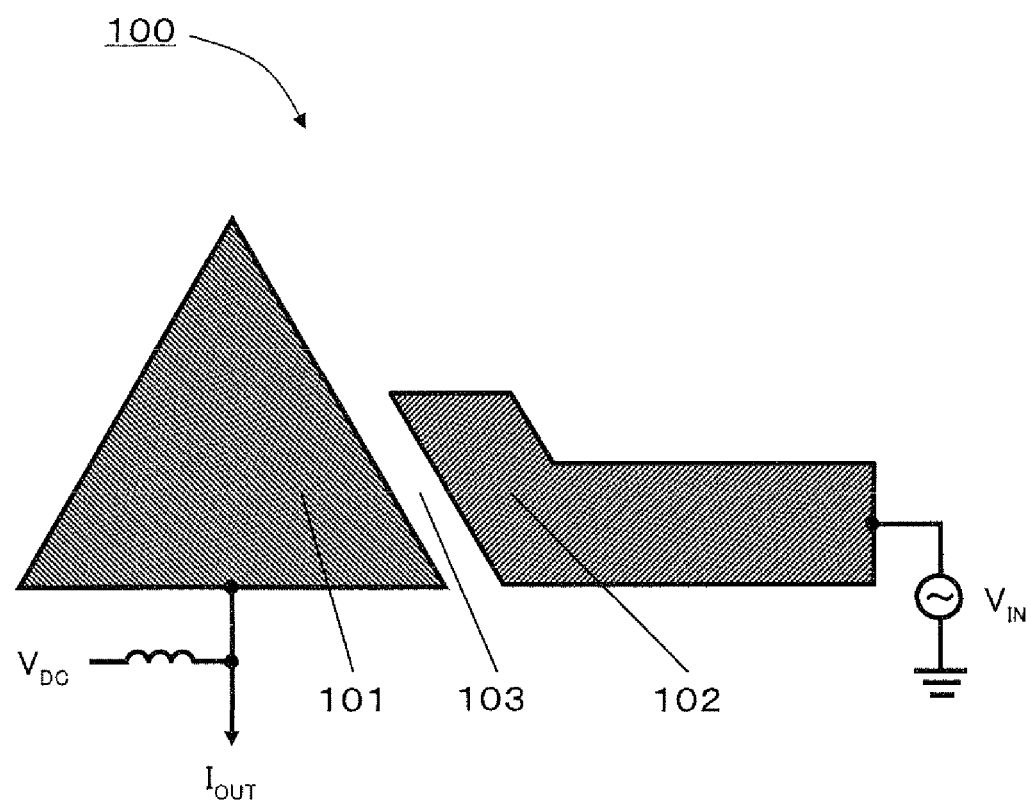
FIG. 1 is a cross sectional view showing a MEMS resonator structure of a first embodiment.

Details about how One of Aspects of the Present Invention has been Accomplished It is required to apply a direct potential between an electrode and an oscillator in a MEMS resonator. For this reason, either electrode or oscillator is connected with a DC power source. However, with the DC power source, it is problematic that the voltage fluctuates due to fluctuations of load and temperature, and the resonance frequency of the MEMS resonator therefore fluctuates. In order to solve this problem, a possible option is to use a more stable DC power source to reduce the voltage fluctuation. However, a high performance DC power source is required to reduce the voltage fluctuation. The usage of such DC power source increases a size and cost of the device.

One of aspects of the present invention has features that a oscillator is a beam and oscillates in a torsional oscillation mode with the center being its longitudinal axis, opposing faces of the oscillator and an electrode are made of impurity-doped semiconductors of which conductive types are different from each other respectively, and the oscillator is doped with an impurity at a higher density in the surface part that includes the opposing face to the electrode than the other part of the oscillator. According to these features, a flat band voltage between the electrode and oscillator can be used for driving the oscillator, and the oscillator can drive with a reduced output voltage of the DC power source. As a result, the voltage fluctuation of the DC power source is relatively small, and the resonance frequency fluctuation is thus decreased. Also, since the impurity density is low in some part of the oscillator, energy loss at the oscillator is comparatively low.

By selecting a structure and material of the resonator, it is also possible to drive the oscillator even when the output voltage of the DC power source is 0 V. That is, it is possible to drive the oscillator by grounding it directly, not using the DC power source. In this case, since a stable voltage is applied from the flat band voltage, the voltage fluctuation due to the DC power source is not caused, and the resonance frequency fluctuation is thus further decreased.

(First Aspect)
A first aspect is a MEMS resonator including:
a beam oscillator that oscillates mechanically when an electrostatic force is applied;
a supporter that oscillatably supports the oscillator; and
at least one electrode that includes an opposing face to the oscillator across a gap,
wherein one of the oscillator and electrode is an input electrode and the other is an output electrode,
the oscillator is excited by the electrostatic force caused by an AC signal that is applied through an input terminal connected with the input electrode, and an electric current generated by the oscillation of the oscillator is output through an output terminal connected with the output electrode,
the oscillator oscillates in a torsional resonance mode with a center being a longitudinal axis of the beam oscillator,
an opposing face of the oscillator and the opposing face of electrode that are opposed to each other are made of impurity-doped semiconductors of which conductive types are different from each other respectively, and
a surface part of the oscillator including the opposing face to the electrode is doped with an impurity at a higher density than other part of the oscillator.

(Second Aspect)
A second aspect is the MEMS resonator according to the first aspect, wherein no terminal that is to be connected to a DC power source is provided.

(Third Aspect)
A third aspect is the MEMS resonator according to the first or second aspect, wherein the density of the impurity is $10^{15}/cm^3$ or more and $10^{20}/cm^3$ or less.

(Fourth Aspect)
The fourth aspect is the MEMS resonator according to any one of the first to third aspects, wherein the oscillator is doped with the dopant only in the surface part.

(Fifth Aspect)
A fifth aspect is the MEMS resonator according to the first aspect,
wherein the electrode is two electrodes that are opposed to different faces of the oscillator,
the two electrodes are one and the other of the input and output electrodes, and
the oscillator is adapted to be grounded.

(Sixth Aspect)
A sixth aspect is a module including:
the MEMS resonator according to any one of the first to fifth aspects;
a DC power source; and
an integrated circuit,
wherein the MEMS resonator is connected to the integrated circuit, but is not connected to the DC power source.

(Seventh Aspect)
A seventh aspect is the module according to the sixth aspect, further including a housing,
wherein the MEMS resonator is grounded to the housing.

(Eighth Aspect)
An eighth aspect is an electrical device including the MEMS resonator of any one of the first to fifth aspects.

(Ninth Aspect)
A ninth aspect is an electrical device including the module according to the sixth or seventh aspect.

(Tenth Aspect)
A tenth aspect is a method of generating a signal by use of the MEMS resonator according to any one of the first to fifth aspects, the signal having a frequency equal to a resonance frequency of the mechanical oscillation of the oscillator,
wherein the MEMS resonator drives only by a flat band voltage that is generated between the opposing faces of the oscillator and electrode.

Embodiments of the present invention will be described below with reference to the accompanying drawings.

First Embodiment

FIG. 1 is a cross sectional view showing a structure of an oscillator and an electrode of a MEMS resonator of the present embodiment. A MEMS resonator 100 shown in FIG. 1 includes a flexible oscillator 101 and an electrode 102. FIG. 1 show a cross section along a plane perpendicular to the longitudinal direction of the oscillator 101, and the oscillator 101 is of a triangular cross-section beam structure. The oscillator 101 oscillates in a torsional oscillation mode with the center being its longitudinal axis (the direction perpendicular to the plane of the drawing). In FIG. 1, the oscillator 101 and the electrode 102 are opposed to each other at a sloped face of the oscillator 101, so as to form an electrostatic capacitance.

In the embodiment shown in the drawing, the oscillator 101 is an output electrode (i.e. detection electrode) and the electrode 102 is an input electrode (i.e. excitation electrode). A signal generated by the oscillator 101 is output from a supporter (not shown) that oscillatably supports the oscillator 101. Also, in the embodiment shown in the drawing, a DC power source is connected to the supporter of the oscillator 101, and a DC voltage is applied between the oscillator 101 and electrode 102.

In the MEMS resonator 100 shown in FIG. 1, the oscillator 101 and electrode 102 are each made of a semiconductor material, such as Si and SiGe, that is doped with an impurity at a high density. Opposing faces of the oscillator 101 and electrode 102 are made of semiconductors of which conductive types are different from each other, respectively. For example, if the oscillator 101 is made of a p-type semiconductor material, the electrode 102 is made of an n-type semiconductor material. If the oscillator 101 is made of an n-type semiconductor material, the electrode 102 is made of a p-type semiconductor material. It is preferable that at least one of, preferably both of the opposing faces of the oscillator 101 and electrode 102 has such an impurity density as an acceptor density $N_A$ or a donor density $N_D$ of $10^{15}/CM^3$ to $10^{20}/CM^3$. With the impurity density within this range, it is possible to increase the flat band voltage described below.

Since different conductive-type semiconductors are opposed to each other in the microelectromechanical resonator 100 of this structure, a difference of the Fermi levels $E_F$ between the oscillator 101 and electrode 102 can increase, and the flat band voltage $V_{FB}$ can increase. When the oscillator 101/gap 103/the electrode 102 form a junction of semiconductor/insulator/semiconductor, an energy level at the junction interface bends to equalize the Fermi levels of the oscillator 101 and electrode 102. The flat band voltage $V_{FB}$ is a voltage required to flatten this bent energy level.

The flat band voltage excites electrical charges in the opposing faces of the oscillator 101 and electrode 102, and these charges are added to the output signal to enhance it. Specifically, since a drive voltage $V_{DC}$, which is a required voltage applied to the oscillator 101 for its oscillation, is partially supplied from the flat band voltage, a voltage supplied from the DC power source is reduced. As a result, fluctuations of load and temperature have less influence on a potential of the oscillator, which fluctuations are caused by the DC power source. Fluctuation of resonance frequency is thus reduced.

The flat band voltage $V_{FB}$ corresponds to a difference in the Fermi levels $E_F$ between the oscillator 101 and electrode 102, and is represented by the following expression. This expression is based on a case where the oscillator 101 and electrode 102 are respectively made of p-type and n-type semiconductors.

$$V_{FB} = \frac{kT}{q} \ln\left(\frac{N_D N_A}{n_i^2}\right) \quad \text{[Equation 1]}$$

In the equation, k represents the Boltzmann constant, T represents temperature, q represents elementary charge, and $n_i$ represents carrier density of an intrinsic semiconductor.

When the flat band voltage is high, the amount of accumulated charge increases, enabling the output signal to increase. To increase the flat band voltage, at least one of, preferably both of the oscillator 101 and electrode 102 is made of a high-doped semiconductor to increase the difference in the Fermi levels.

If the acceptor density $N_A$ or the donor density $N_D$ is less than $10^{15}/cm^3$, a difference in the Fermi levels between the oscillator 101 and electrode 102 and the flat band voltage decrease, resulting in insufficient achivement of the effect of decreasing an output voltage of the DC power source. According to the current technology, the upper limit of the acceptor density $N_A$ or the donor density $N_D$ is about $10^{20}/cm^3$. However, the upper limit of the acceptor density $N_A$ or the donor density $N_D$ is not limited in the present embodiment. If a larger density is realizable, it will be preferably $10^{20}/cm^3$ or more.

Figure 2:
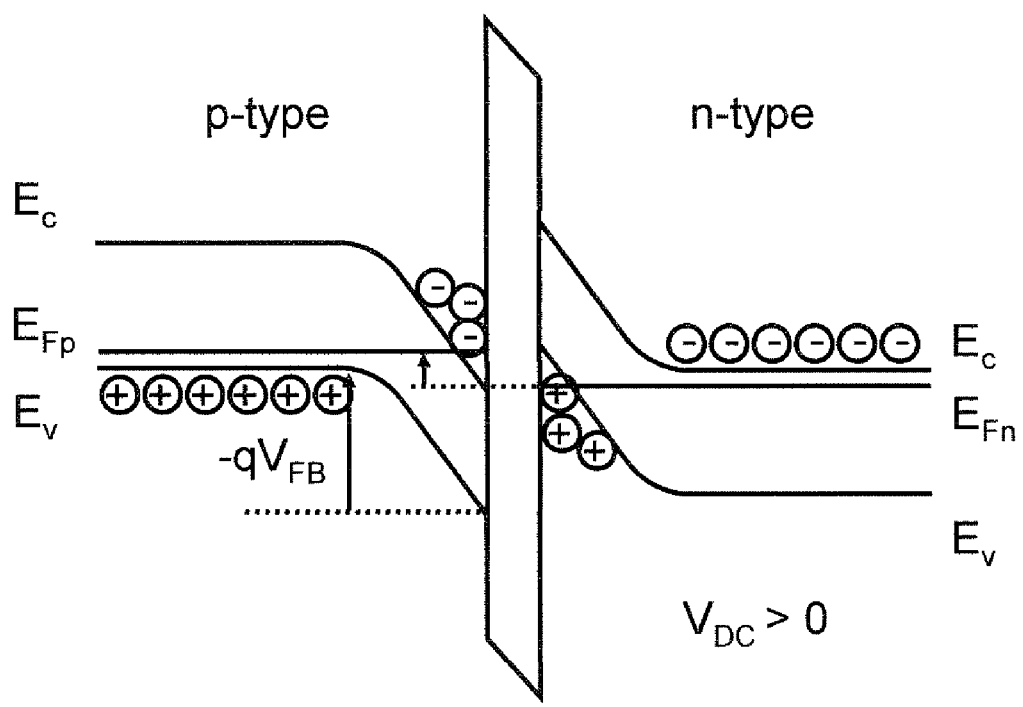
FIG. 2 is a band diagram of the MEMS resonator of the first embodiment.

FIG. 2 shows a band diagram of a case where the oscillator 101 is made of an n-type semiconductor, and the electrode is made of a p-type semiconductor. In this case, the opposing faces of the oscillator 101 and electrode 102 have charges excited by the flat band voltage $V_{FB}$, in addition to charges generated by applying a voltage from the DC power source to the n-type semiconductor oscillator 101.

Figure 3:
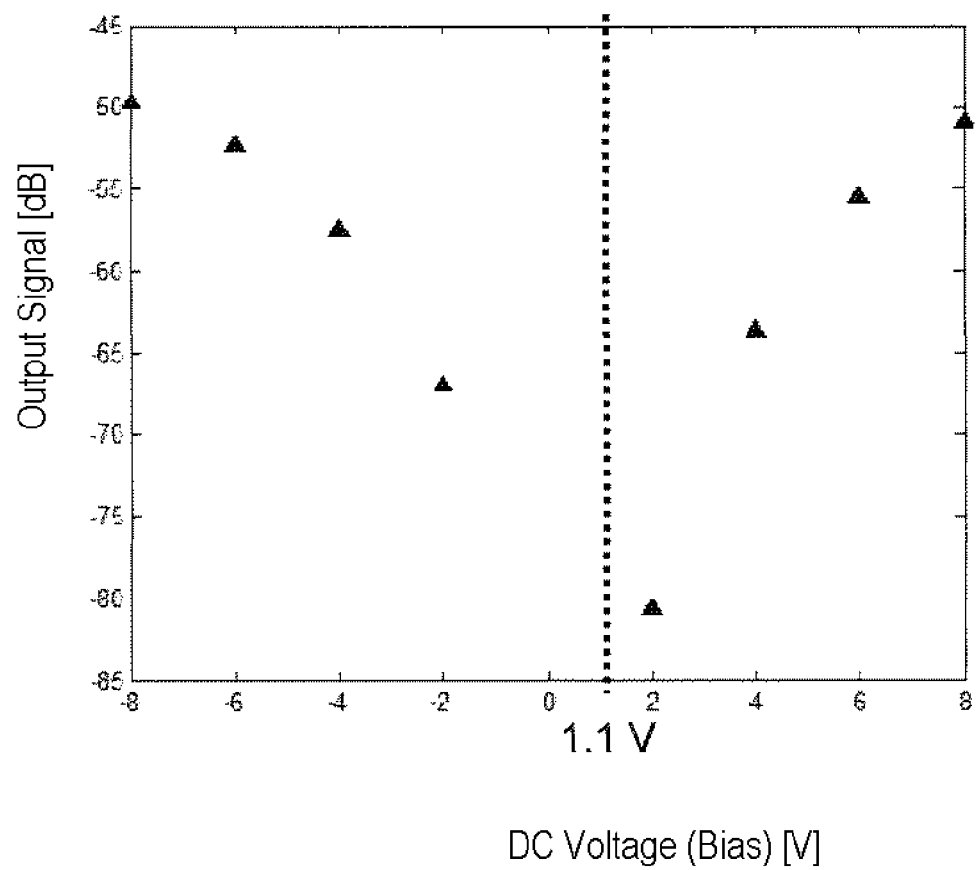
FIG. 3 is a graph showing that the output signal of the MEMS resonator of the first embodiment is dependent on the drive voltage.

If the acceptor density $N_A$ and donor density $N_D$ are $10^{19}/cm^3$ and $10^{20}/cm^3$ respectively, the flat band voltage $V_{FB}$ is 1.1 V. FIG. 3 is a graph showing a result of measuring a dependency of the output signal on the drive voltage. As shown in the drawing, the output signal varies symmetrically as the drive voltage varies from minus to plus. The flat band voltage is measured as a shift of the symmetrical center of the symmetrical output signal from 0 V. As shown in FIG. 3, a shift of the symmetrical center from 0 V is 1.1 V.

According to the above structure, the flat band voltage supplies 1.1 V of the required drive voltage. In other words, the voltage from the DC power source, which is supplied in order to obtain a desired output signal, can be reduced by 1.1 V comparing to a case where the flat band voltage is 0 V. The MEMS resonator of the present embodiment requires a drive voltage of about 2.9 V for generating a sufficiently strong output signal. The voltage supplied from the DC power source is reduced from 2.9 V to 1.8 V accordingly. In general, the larger the output voltage of the DC power source is, the larger its voltage fluctuation caused by load and temperature fluctuations is. As a result, fluctuation of the drive voltage can reduce, resulting in reduction in fluctuation of the resonance frequency in the MEMS resonator of the present embodiment.

Figure 4:
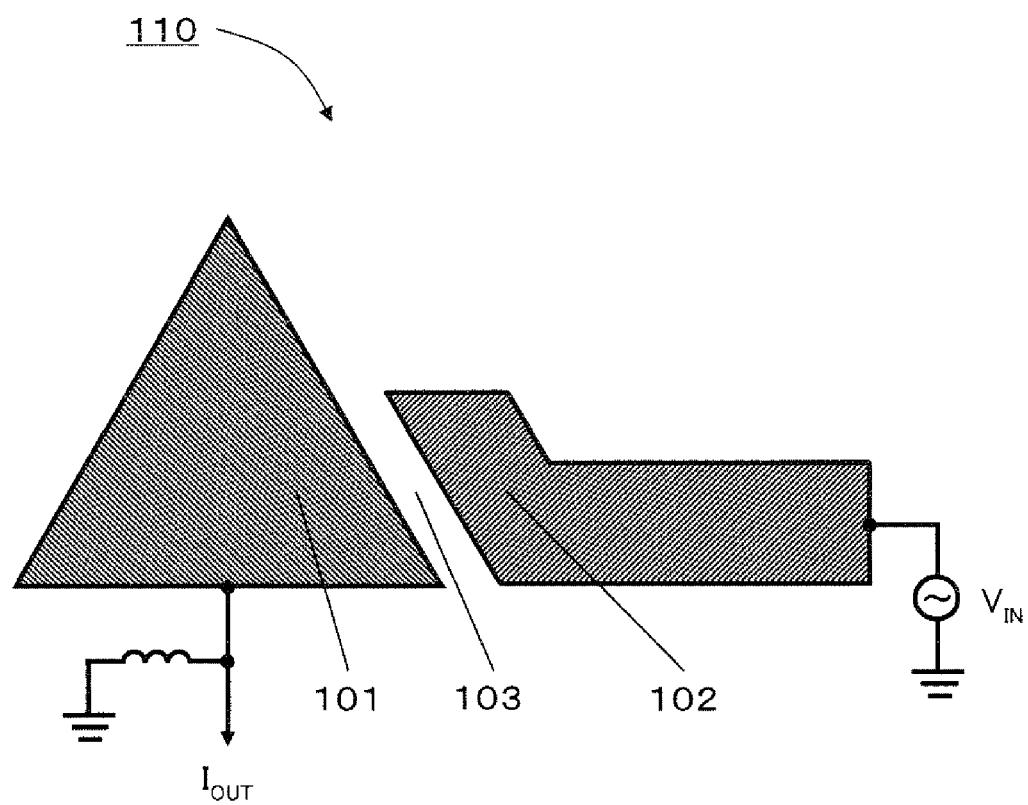
FIG. 4 is a cross sectional view showing a MEMS resonator structure of a variation of the first embodiment.

It is also possible to eliminate the DC power source by properly designing the gap between the oscillator 101 and electrode 102 or the like so as to decrease the drive voltage and/or by selecting the materials so as to increase the flat band voltage. In this case, the oscillator 101 may be grounded directly. FIG. 4 shows a MEMS resonator 110 as a variation of the present embodiment, in which the DC power source is not provided. The oscillator 110 is directly grounded in this variation. The potential of the oscillator is therefore stable, since it is not subjected to the influence of fluctuations of load and temperature, which is caused by the DC power source. As a result, fluctuation of the resonance frequency can be further reduced. The MEMS resonator may be grounded, for example, by connecting it to a housing of the MEMS resonator 110 (for example, a housing of the module components).

In another variation, it is also possible to eliminate the DC power source but not to ground the oscillator 101. In this case, the potential of the oscillator 101 is determined by the potential of a component or an element that is connected to the output terminal connected to the supporter of the oscillator 101 (input terminal, if the oscillator 101 is the input electrode). According to the MEMS resonator of this variation, the number of parts can be reduced, and the manufacturing process can be simplified.

Impurity density and conductive type of the semiconductors used for the oscillator 101 and electrode 102 may be optimally determined in consideration of manufacturability and cost.

In another variation, the oscillator 101 and electrode 102 may be the input electrode (i.e. excitation electrode) and output electrode (i.e. detection electrode) respectively, so that the drive voltage from the DC power source is applied to the electrode 102.

As mentioned above, the flat band voltage is low. Thus, in a MEMS resonator of a flexural oscillation mode (an oscillation mode wherein the oscillation direction is a uniaxial one), which requires a drive voltage of 4.0 V or more, the flat band voltage has little effect of reducing the voltage from the DC power source. That is, if the drive voltage is high, it is required to supply a considerable amount of the drive voltage from the DC power source even with the flat band voltage, and a reduction rate of the drive voltage from the DC power source is low. As a result, the flat band voltage barely contributes to reducing fluctuation of the resonance frequency. In contrast, MEMS resonators of the torsional oscillation mode such as the present embodiment can generate a large output signal with a low drive voltage. The use of the flat band voltage allows the voltage of the DC power source to account for a smaller proportion of the drive voltage, or eliminates the DC power source in some cases. As a result, in the MEMS resonator of the present embodiment, fluctuation of the resonance frequency is decreased more significantly.

Second Embodiment

Figure 5:
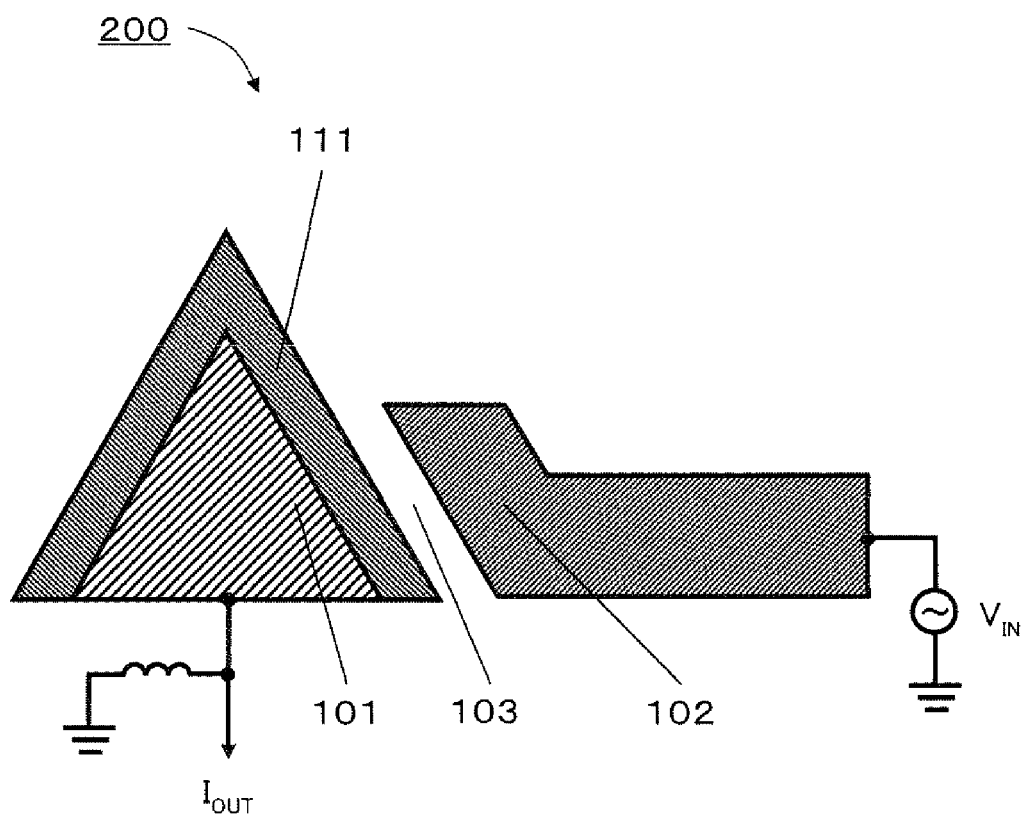
FIG. 5 is a cross sectional view showing a MEMS resonator structure of a second embodiment.

FIG. 5 is a cross sectional view showing a structure of an oscillator and an electrode of a MEMS resonator of a second embodiment. A MEMS resonator 200 shown in FIG. 5 includes an oscillator 101 that is of a triangular cross-section beam structure and an electrode 102, similarly to the MEMS resonator 100 of the first embodiment. In the present embodiment, the oscillator 101 is an output electrode, and the electrode 102 is an input electrode. A signal generated in the oscillator 101 is output from a supporter (not shown) that oscillatably supports the oscillator 101. In FIG. 5, the oscillator 101 and electrode 102 are opposing to each other at a sloped face of the oscillator 101, so as to form an electrostatic capacitance.

The MEMS resonator 200 shown in FIG. 5 is different from the MEMS resonator 100 of the first embodiment in that a high-doped area 111 is formed in the surface part of the oscillator 101 including the opposing face to the electrode 102, where an impurity is doped at a higher density than the other part, and the oscillator 101 is not connected to a DC power source but is grounded directly. Since only the surface, which has influence on the flat band voltage, is doped at a high concentration, it is easier to obtain a higher impurity density and thus to generate a higher flat band voltage. As a result, the MEMS resonator 200 may be driven without a DC power source.

The opposing face to the electrode 102 is a sloped face in the oscillator 101 of the shape as shown in the drawing. Since the sloped face is easy to dope with an impurity, it is comparatively easy to obtain the MEMS resonator 200 shown in FIG. 5. Specifically, the MEMS resonator shown in FIG. 5 is obtained by forming the oscillator 101 and doping it with an impurity, forming the electrode 102 and doping it with an impurity, and then forming a gap 103 by sacrifice layer etching.

Preferable impurity density (acceptor density or donor density) of the high-doped area 111 is as described in relation with the first embodiment.

The other part of the oscillator 101 than the high-doped area 111 (i.e. the part other than the surface part) may be a low-doped area made of a semiconductor doped with an impurity at a lower density, or an area made of a non-doped semiconductor. The lower impurity density of the part other than the surface part is, the higher regularity of the crystal lattice of the part is. As a result, since an elastic wave propagates better in the other part during the oscillation of the oscillator 101, energy loss at the oscillator 101 is less and a high Q factor is likely to be maintained.

If the part of the oscillator 101 other than the high-doped area 111 is a low-doped area, the low-doped area has an impurity density of, for example, less than $10^{15}/cm^3$. The high-doped area 111 may be formed to a depth of 1 nm to 100 nm from the surface of the oscillator 101. The boundary of the high-doped area and low-doped area may be unclear. For example, the impurity density may be decreased gradually or stepwise from the surface to the center of the oscillator 101.

In a variation of the present embodiment, another high-doped area may be formed in the opposing face of the electrode to the oscillator, instead of or in addition to the opposing face of the oscillator to the electrode.

In the present embodiment, the surface(s) of the oscillator and/or electrode is doped with an impurity at a high concentration. The flat band voltage is therefore increased, and the oscillator 101 can be directly grounded as shown in FIG. 5, not using a DC power source. As a result, in the MEMS resonator 200 of the present embodiment, the potential of the oscillator is stable and fluctuation of the resonance frequency is further reduced similarly to the MEMS resonator 110 that is described with reference to FIG. 4, since the potential of the oscillator is not subjected to influence of fluctuations of load and temperature, which is caused by a DC power source. A DC power source may be used as necessary. If it is used, the same effect is obtained as described in relation with the MEMS resonator 100 with reference to FIG. 1. Also in the present embodiment, the oscillator 101 may be grounded by connecting it to a housing of the MEMS resonator 200.

Also in the present embodiment, which is the MEMS resonator with the triangular cross-section oscillator operating in the torsional oscillation mode, it is also possible that the high-doped area 111 is only formed in the surface of the oscillator 101, and the inside of the oscillator 101 is made of a semiconductor having a higher regularity (for example, monocrystalline Si). As a result, further less energy loss is achieved by the oscillator 101, and thus a higher Q factor is achieved in the MEMS resonator of the present embodiment.

Also in the present embodiment, the oscillator 101 may not be grounded as described in relation with the first embodiment.

Third Embodiment

Figure 6:
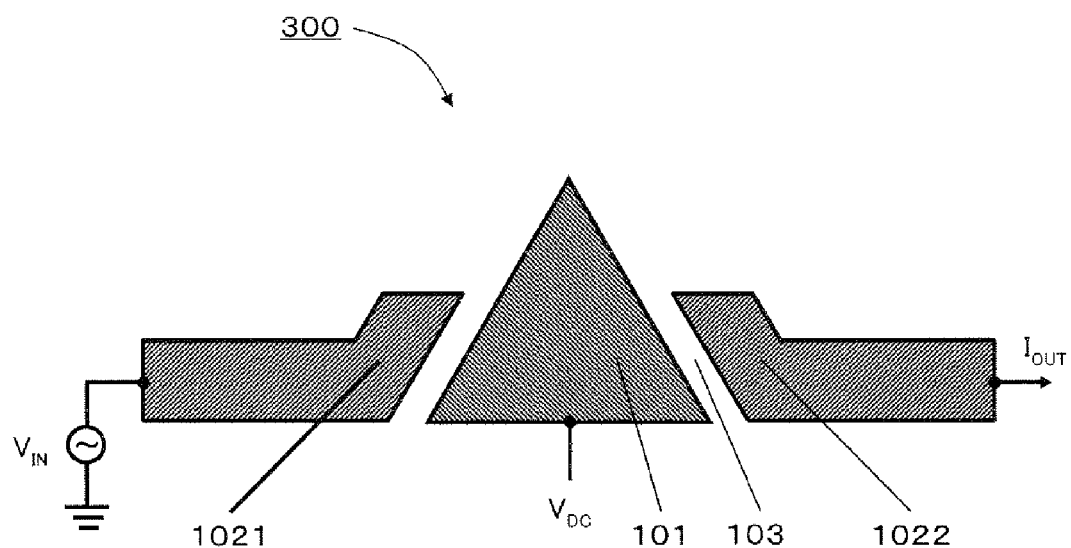
FIG. 6 is a cross sectional view showing a MEMS resonator structure of a third embodiment.

FIG. 6 is a cross sectional view showing a structure of an oscillator and electrode of a MEMS resonator of a third embodiment.

A MEMS resonator 300 shown in FIG. 6 includes a movable oscillator 101, an input electrode 1021 and an output electrode 1022. In the MEMS resonator 300 shown in FIG. 6, the oscillator 101 is opposed to each of the input electrode 1021 and output electrode 1022 at two respective sloped faces of the oscillator 101. A DC power source is connected to the oscillator 101 through a supporter (not shown) that oscillatably supports it, so as to supply a DC voltage between the oscillator 101 and the electrode 1021 and between the oscillator 101 and the electrode 1022. The oscillator 101 is excited by an AC voltage applied to the electrode 1021, and a high frequency signal of the resonance frequency is output from the electrode 1022.

In the microelectromechanical resonator 300 shown in FIG. 6, the oscillator 101 and the input and output electrodes 1021 and 1022 are each made of a semiconductor material such as Si and SiGe. In the embodiment shown in the drawing, the oscillator 101 is made of a high-doped p-type semiconductor, and the input and output electrodes 1021 and 1022 are made of the opposite conductive type semiconductor material, i.e. an n-type semiconductor material. It is preferable that the surfaces of the oscillator 101, input electrode 1021 and output electrode 1022, which face with the gap 103, are all made of semiconductors having impurity density (acceptor or donor density) as described in relation with the first embodiment.

In the present embodiment, the oscillator 101 constantly has a potential difference corresponding to the flat band voltage with respect to the input and output electrodes 1021 and 1022. A DC voltage applied from the DC power source to the oscillator 101, which is required in order to obtain an output signal of desired intensity, is thus decreased. In a variation of the present embodiment, it is also possible to eliminate the DC power source and directly ground the oscillator 101 by properly designing the gap of the MEMS resonator or the like to decrease the drive voltage and/or selecting materials that increase the flat band voltage.

Also in the variation of the embodiment, the oscillator 101 may not be grounded as described in relation with the first embodiment.

Fourth Embodiment

Figure 7:
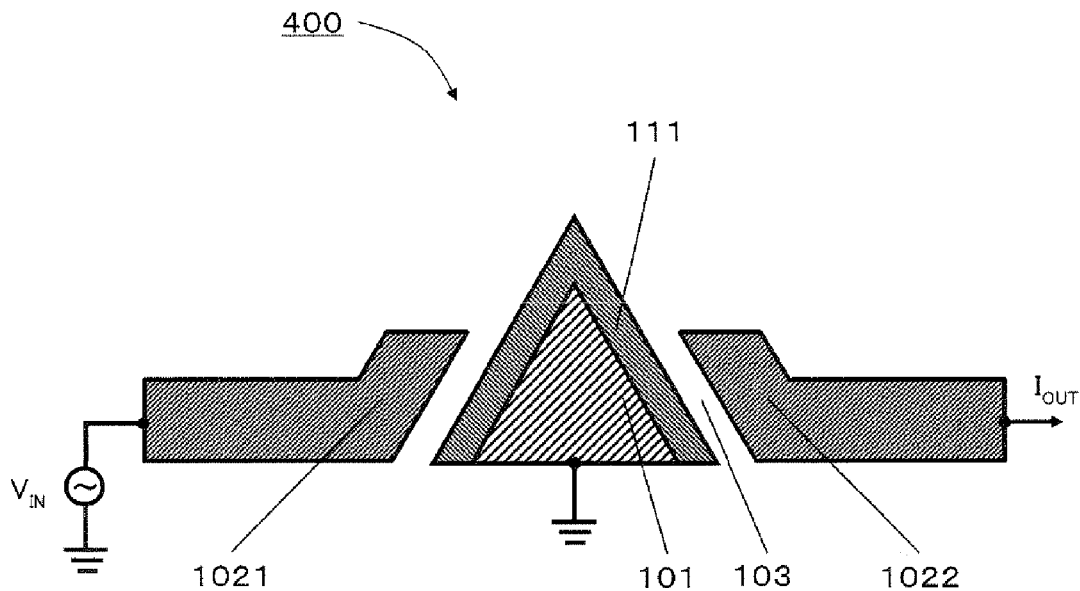
FIG. 7 is a cross sectional view showing a MEMS resonator structure of a fourth embodiment.

FIG. 7 is a cross sectional view showing a structure of an oscillator and an electrode of a MEMS resonator of a fourth embodiment. A microelectromechanical resonator 400 shown in FIG. 7 is different from the MEMS resonator 300 of FIG. 6 in that a high-doped area 111 is formed in the surface part of an oscillator 101, no DC power source is connected, and the oscillator 101 is directly grounded.

The MEMS resonator 400 and the MEMS resonator 200 of the second embodiment are common in that the high-doped area 111 is formed in the surface part of the oscillator 101. As is described in relation with the second embodiment, according to the present embodiment, the flat band voltage between the excitation electrode 1021 and oscillator 101 is further increased, and the potential difference between the excitation electrode 1021 and the oscillator 101 is thus further increased even with a low drive voltage. As a result, the oscillator 101 may be excited and the resonator 400 may be driven only by use of the flat band voltage as the drive voltage, without applying any voltage from a DC power source. Also, since the oscillator 101 is directly grounded, a stable voltage is applied to the oscillator 101 by use of the flat band voltage. According to the present embodiment, influence of voltage fluctuation caused by fluctuations of load and temperature, which occurs by using a DC power source, may be eliminated, and fluctuation of the resonance frequency may be thus prevented.

A preferable impurity density (acceptor density or donor density) of the high-doped area 111 is as described in relation with the first embodiment.

Also in a variation of the present embodiment, the oscillator 101 may not be grounded as described in relation with the first embodiment.

Fifth Embodiment

Described herewith is a fifth embodiment that is a manufacturing method of the MEMS resonator 400 shown in FIG. 7. The MEMS resonator may be manufactured by a thin film forming process (CVD, sputtering, evaporation, and the like) and a patterning process, which are used in semiconductor manufacturing and the like. The process is as shown in FIGS. 8(a) to 8(e).

Figure 8A:
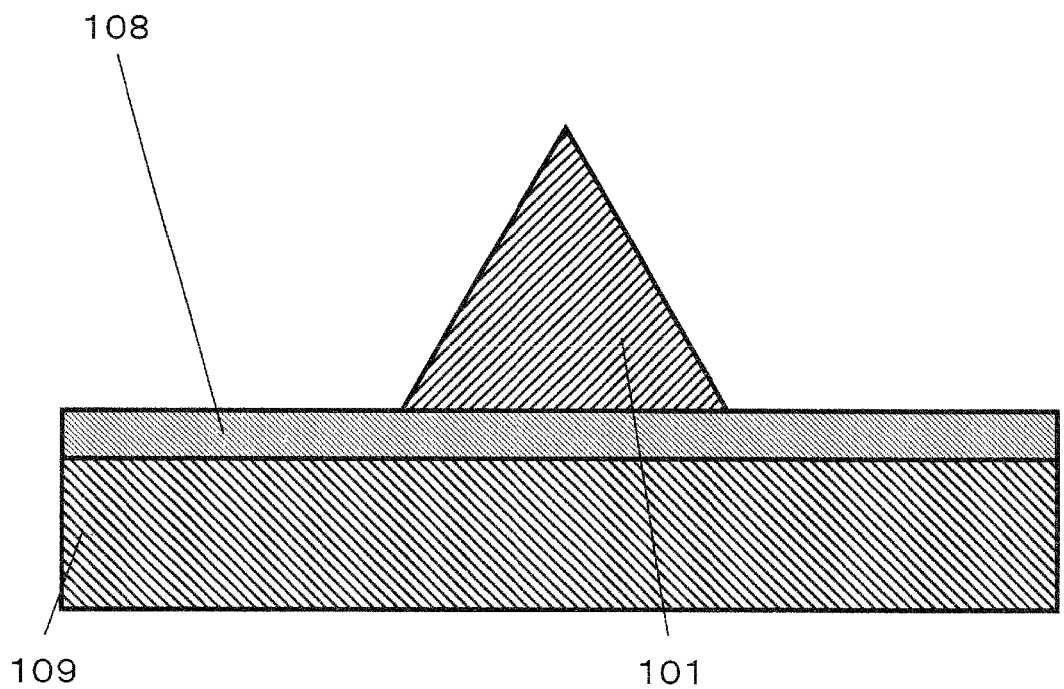
FIG. 8(a) is a cross sectional view showing a step of the manufacturing method of the MEMS resonator of a fifth embodiment.

Specifically, as shown in FIG. 8(a), a support layer 108 and an oscillator 101 are formed on a substrate 109, the oscillator 101 is patterned by a process such as photolithography and anisotropic etching to form sloped faces of the triangular cross-section oscillator. The substrate 109 is made of a semiconductor material such as Si, the support layer 108 is made of a semiconductor material such as $SiO_2$, and the oscillator 101 is made of a semiconductor material such as Si or SiGe.

Figure 8B:
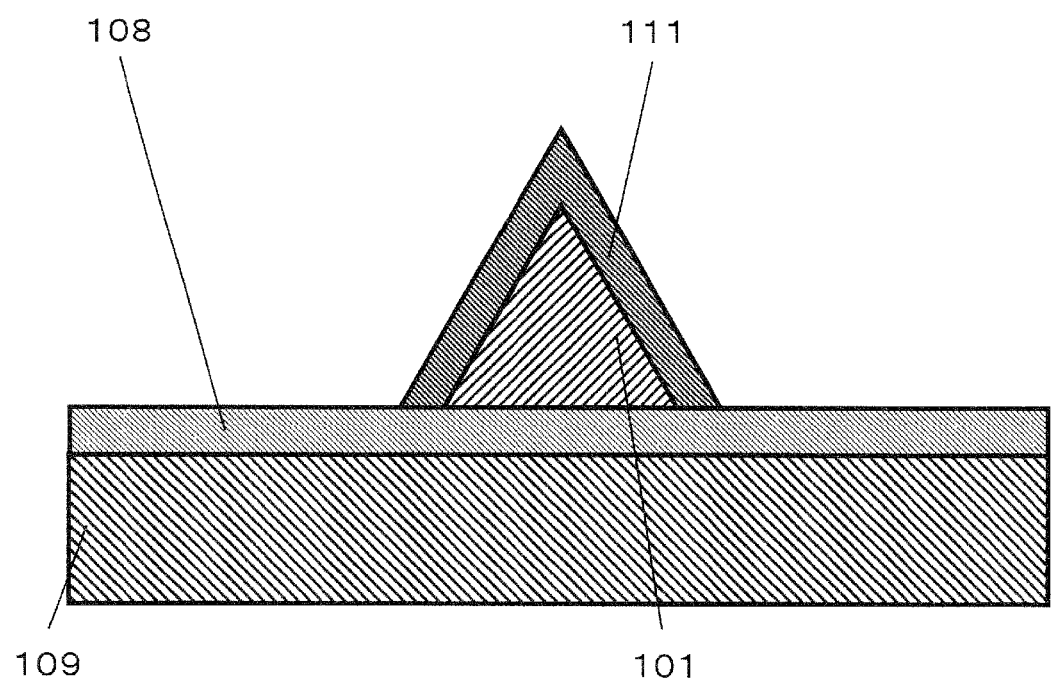
FIG. 8(b) is a cross sectional view showing a step of the manufacturing method of the MEMS resonator of the fifth embodiment.

Next, as shown in FIG. 8(b), a high-doped area 111 is formed in the surface of the oscillator 101 by a doping step. The high-doped area 111 is formed by doping with an impurity at a high density, and is made of a p- or n-type semiconductor material of Si, SiGe or the like according to the type of the dopant. In the case of forming a p-type semiconductor material of Si, SiGe or the like, for example, B (boron) is doped. In the case of forming an n-type semiconductor material of Si, SiGe or the like, for example, P (phosphorus) is doped.

The impurity density, i.e. acceptor density $N_A$ or donor density $N_D$ is, for example, $10^{15}/cm^3$ or more and $10^{20}/cm^3$ or less. A thickness of the high-doped area 111 may be 1 nm or more and 100 nm or less.

Figure 8C:
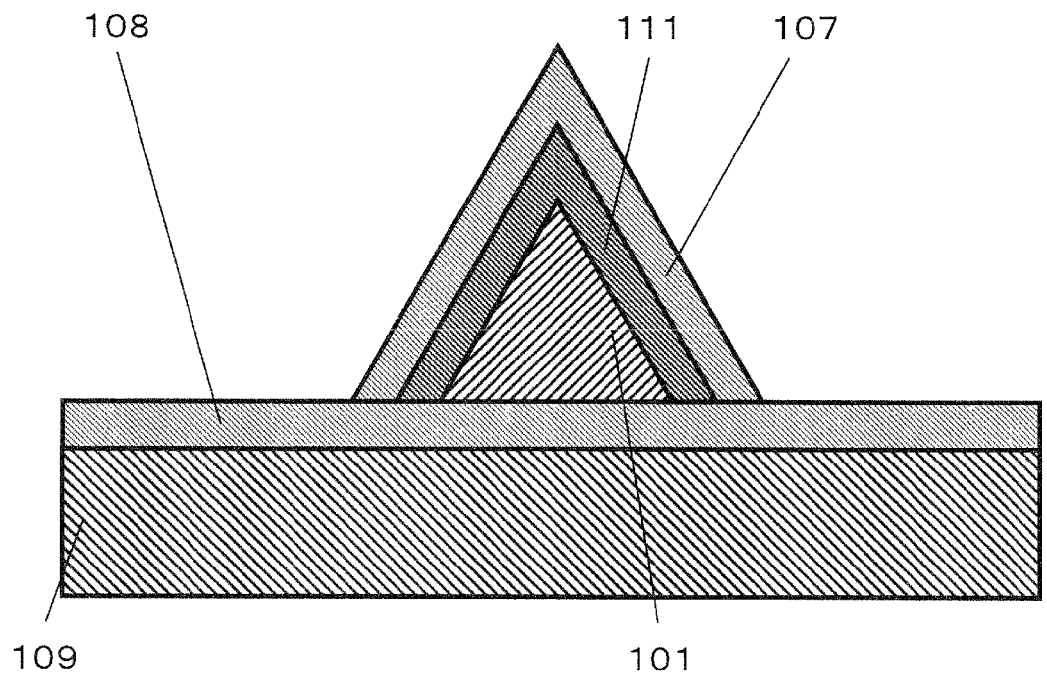
FIG. 8(c) is a cross sectional view showing a step of the manufacturing method of the MEMS resonator of the fifth embodiment.

Next, as shown in FIG. 8(c), after forming a sacrifice layer 107 that is to be used to form the gaps 103 between the oscillator 101 and the input electrode 1021 and between the oscillator 101 and the output electrode 1022, the sacrifice layer 107 is patterned by a process such as photolithography and etching. The sacrifice layer 107 is made of $SiO_2$ or the like.

Figure 8D:
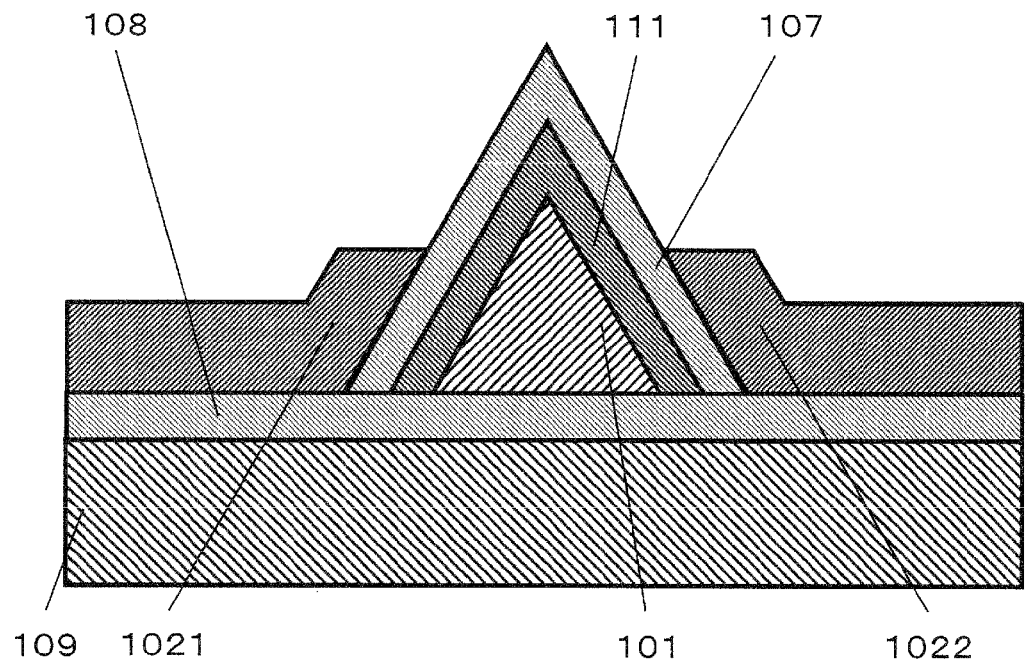
FIG. 8(d) is a cross sectional view showing a step of the manufacturing method of the MEMS resonator of the fifth embodiment.

Next, as shown in FIG. 8(d), after forming the input and output electrodes 1021 and 1022, they are patterned by a process such as photolithography and etching. The input and output electrodes 1021 and 1022 are made of a p- or n-type semiconductor material of Si, SiGe or the like, doped with an impurity at a high density. The impurity density of the input and output electrodes 1021 and 1022, i.e. acceptor density $N_A$ or donor density $N_D$, is preferably $10^{15}/cm^3$ or more and $10^{20}/cm^3$ or less.

Figure 8E:
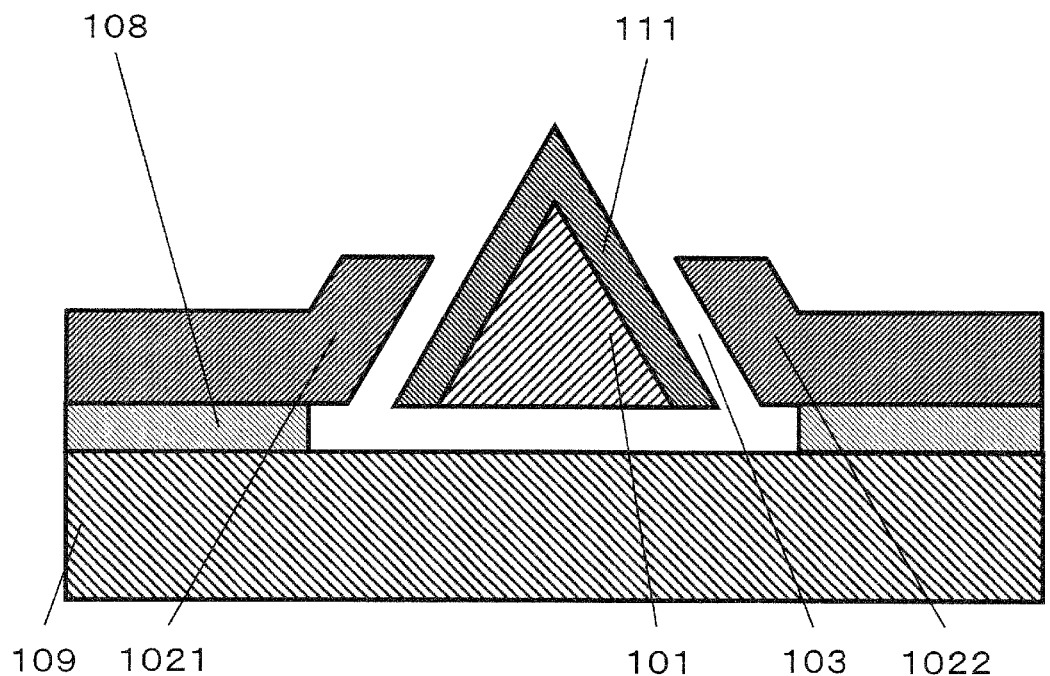
FIG. 8(e) is a cross sectional view showing a step of the manufacturing method of the MEMS resonator of the fifth embodiment.

Next, as shown in FIG. 8(e), the sacrifice layer 107 and part of the support layer 108 are removed to form the oscillator 101 of a fixed-fixed structure.

According to this manufacturing method, since the side walls of the oscillator 101 are sloped faces, the oscillator 101 is doped with the impurity uniformly in the opposing faces to the input and output electrodes 1021 and 1022.

As mentioned above, all of the MEMS resonators described in the first to fifth embodiments may drive without applying a voltage from a DC power source due to a combination of using the oscillator that oscillates in the torsional oscillation mode driven by a low voltage and forming the surfaces of the oscillator and electrode with different conductive-type semiconductors from each other. When the MEMS resonators of the first to fifth embodiments are mounted on a circuit board together with the other elements or components, they can be mounted without being connected with a DC power source. If such mounting is possible, the MEMS resonator of the first to fifth embodiments may not be provided with a terminal for connecting to a DC power source.

A module including any of the MEMS resonators of the above embodiments, a DC power source and an integrated circuit (IC) that executes a predetermined function can be provided as a module in which the MEMS resonator is not connected to a DC power source. In this case, since the DC power source is used to drive the IC and the other possible components, and do not have to drive the MEMS resonator, its voltage can be decreased. In the module in which the MEMS resonator is not connected to the DC power source, the MEMS resonator may be grounded to, for example, the housing thereof.

The MEMS resonators of the above embodiments and the modules including any of the MEMS resonators of the above embodiments can be widely applied to, for example, devices such as switching elements, resonators, filters, oscillators, gyroscopes, pressure sensors and mass detecting elements, and electrical devices using any of them. The electrical device includes, for example, cellular phones.

The microelectromechanical resonators according to the embodiments of the present invention are used in various electrical devices as resonators for oscillators and filter resonators.

What is claimed is:

1. A Microelectromechanical system (MEMS) resonator comprising:
    a beam oscillator that oscillates mechanically when an electrostatic force is applied;
    a supporter that moveably supports the oscillator; and
    at least one electrode that includes an opposing face to the oscillator across a gap,
    wherein one of the oscillator and electrode is an input electrode and the other is an output electrode,
    the oscillator is excited by the electrostatic force caused by an AC signal that is applied through an input terminal connected with the input electrode, and an electric current generated by the oscillation of the oscillator is output through an output terminal connected with the output electrode,
    the oscillator oscillates in a torsional resonance mode with a center being a longitudinal axis of the beam oscillator,
    an opposing face of the oscillator and the opposing face of electrode are opposed to each other and are made of first and second impurity-doped semiconductors,
respectively, and conductive types of the first impurity-doped semiconductor and the second impurity-doped semiconductor are different from each other, and
    a surface part of the oscillator including the opposing face to the electrode is doped with an impurity at a higher density than other part of the oscillator.

2. The MEMS resonator according to claim 1, wherein no terminal that is to be connected to a DC power source is provided.

3. The MEMS resonator according to claim 1, wherein the density of the impurity is $10^{15}/cm^3$ or more and $10^{20}/cm^3$ or less.

4. The MEMS resonator according to claim 1, wherein the oscillator is doped with the dopant only in the surface part.

5. The MEMS resonator according to claim 1,
    wherein the electrode is two electrodes that are opposed to different faces of the oscillator,
    one of the two electrodes is an input electrode and the other of the two electrodes is an output electrode, and
    the oscillator is adapted to be grounded.

6. A module comprising:
    the MEMS resonator according to claim 1;
    a DC power source; and
    an integrated circuit,
    wherein the MEMS resonator is connected to the integrated circuit, but is not connected to the DC power source.

7. The module according to claim 6, further comprising a housing,
    wherein the MEMS resonator is grounded to the housing.

8. An electrical device comprising the MEMS resonator according to claim 1.

9. An electrical device comprising the module according to claim 6.

10. A method of generating a signal by use of the MEMS resonator according to claim 1, the signal having a frequency equal to a resonance frequency of the mechanical oscillation of the oscillator,
    wherein the MEMS resonator drives only by a flat band voltage that is generated between the opposing faces of the oscillator and electrode.

* * * * *